United States Patent
Opris

(10) Patent No.: US 7,459,937 B1
(45) Date of Patent: Dec. 2, 2008

(54) LOW VOLTAGE CMOS DRIVER FOR INDUCTIVE LOADS

(76) Inventor: Ion E. Opris, 2198 Lark Hills Ct., San Jose, CA (US) 95138

(*) Notice: Subject to any disclaimer, the term of this patent is extended or adjusted under 35 U.S.C. 154(b) by 44 days.

(21) Appl. No.: 11/298,156

(22) Filed: Dec. 9, 2005

(51) Int. Cl.
   *H03K 19/094* (2006.01)
   *H03K 19/0175* (2006.01)

(52) U.S. Cl. .................. 326/83; 326/82; 326/119

(58) Field of Classification Search ........... 326/82–83, 326/119, 121; 327/110, 112
   See application file for complete search history.

(56) References Cited

U.S. PATENT DOCUMENTS

2001/0018326 A1* 8/2001 Link, II ............. 455/3.05
2003/0128015 A1* 7/2003 Zuniga et al. ............ 323/282

* cited by examiner

*Primary Examiner*—Anh Q. Tran

(57) ABSTRACT

A low voltage Complementary Metal Oxide Semiconductor (CMOS) driver circuit for inductive loads is described. The circuit includes at least two first transistor devices, each first transistor device having a drain coupled to an inductive load, a respective second transistor device corresponding to each first transistor device having a drain coupled to a gate of the corresponding first transistor device, and a respective third transistor device corresponding to each first transistor device having a drain coupled to a source of the corresponding first transistor device. If a second transistor device corresponding to a first transistor device of the two first transistor devices is turned off, then a third transistor device corresponding to the remaining first transistor device is turned off, a gate of the first transistor device is floating and a drain-to-gate voltage at the first transistor device is reduced to below a predetermined supply voltage applied at a source of the respective second transistor device.

6 Claims, 9 Drawing Sheets

LOW VOLTAGE CMOS DRIVER FOR INDUCTIVE LOADS

TECHNICAL FIELD

The invention relates generally to the field of analog electronic devices, and more particularly, to a low voltage Complementary Metal Oxide Semiconductor (CMOS) driver circuit for inductive loads.

BACKGROUND

FIG. 1A is a circuit diagram illustrating a prior art CMOS driver for inductive loads. As illustrated in FIG. 1A, a Metal Oxide Semiconductor (MOS) transistor device $M_1$ 110 has a gate coupled to an input signal 105 and a drain coupled to an inductive load L 120.

In the circuit shown in FIG. 1A, and as illustrated in the graph of FIG. 1B, at a predetermined time $t_0$, when the input signal 105 goes to zero and the MOS transistor device 110 is turned off, the voltage at the output $V_{OUT}$ and the drain-to-gate voltage $V_{DG}$ at the transistor device $M_1$ 110 increase abruptly above the supply voltage $V_{DD}$, thus reducing the reliability of the device. Among the various contemplated solutions to improve the reliability of the device by keeping the drain-to-gate voltage $V_{DG}$ always lower than the supply voltage $V_{DD}$, FIG. 2A shows a circuit diagram, wherein two Metal Oxide Semiconductor (MOS) transistor devices $M_1$ 210 and $M_2$ 220 are coupled in series, with the drain of transistor device $M_2$ 220 coupled to an inductive load 250. The gate of transistor device $M_2$ 220 is always coupled to the supply voltage $V_{DD}$, while the gate of transistor device $M_1$ 210 receives an input signal $IN_1$ 201. FIG. 2A illustrates a half bridge circuit, thus corresponding transistor devices $M_3$ 230 and $M_4$ 240 are coupled in series such that the gate of transistor device 240 receives an inverse input signal $^-IN_2$ 202 and the gate of transistor device $M_3$ 230 is grounded. In the circuit shown in FIG. 2A and, as illustrated in the graph of FIG. 2B, when the input signal $^-IN_2$ goes high and the transistor device $M_4$ 240 is turned off, the output voltage $V_{OUT}$ goes below ground and, thus, the drain-to-gate voltage $V_{DG2}$ at the transistor device $M_2$ 220 is greater than the supply voltage $V_{DD}$, thus reducing the reliability of the device. Similarly, when the input signal $IN_1$ goes low and the transistor $M_1$ 210 is turned off, the output voltage goes above $V_{DD}$ and, thus, the drain-to-gate voltage at the transistor device $M_3$ 230 is greater than the supply voltage $V_{DD}$, again affecting the reliability of the device.

SUMMARY

A low voltage Complementary Metal Oxide Semiconductor (CMOS) driver circuit for inductive loads is described. The circuit includes at least two first transistor devices, each first transistor device having a drain coupled to an inductive load, a respective second transistor device corresponding to each first transistor device having a drain coupled to a gate of the corresponding first transistor device, and a respective third transistor device corresponding to each first transistor device having a drain coupled to a source of the corresponding first transistor device. If a second transistor device corresponding to a first transistor device of the two first transistor devices is turned off, then a third transistor device corresponding to the remaining first transistor device is turned off, a gate of the first transistor device is floating and a drain-to-gate voltage at the first transistor device is reduced to below a predetermined supply voltage applied at a source of the respective second transistor device.

DETAILED DESCRIPTION

Figure 1A:
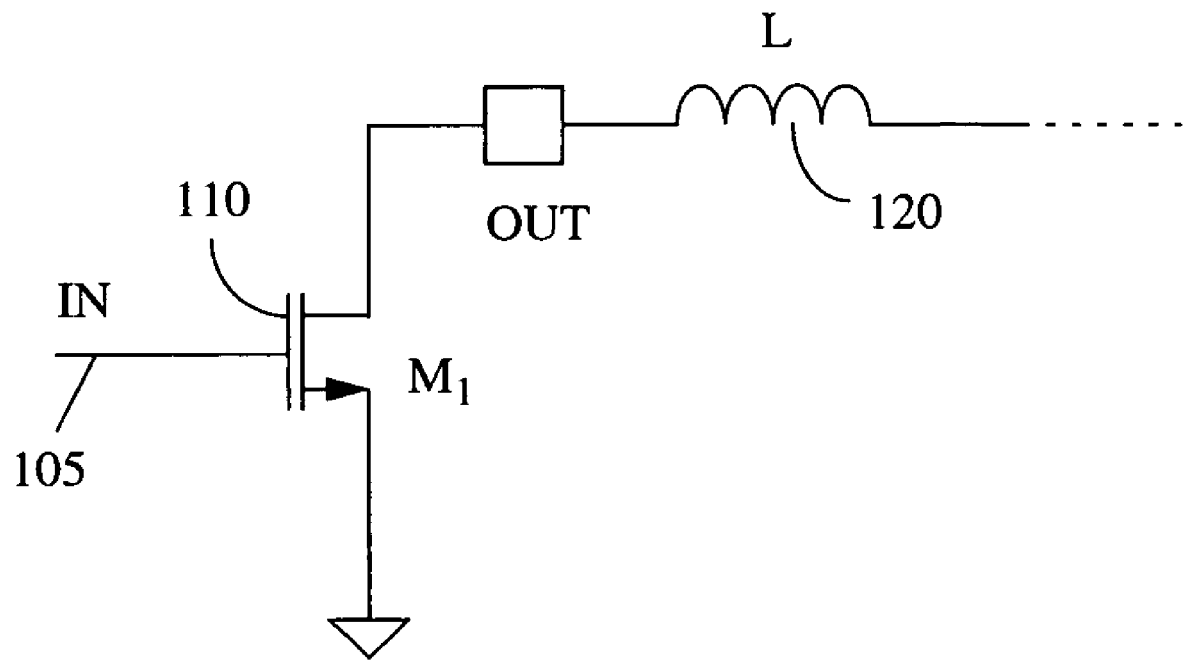
FIG. 1A is a circuit diagram illustrating a prior art CMOS driver for inductive loads.
Figure 1B:
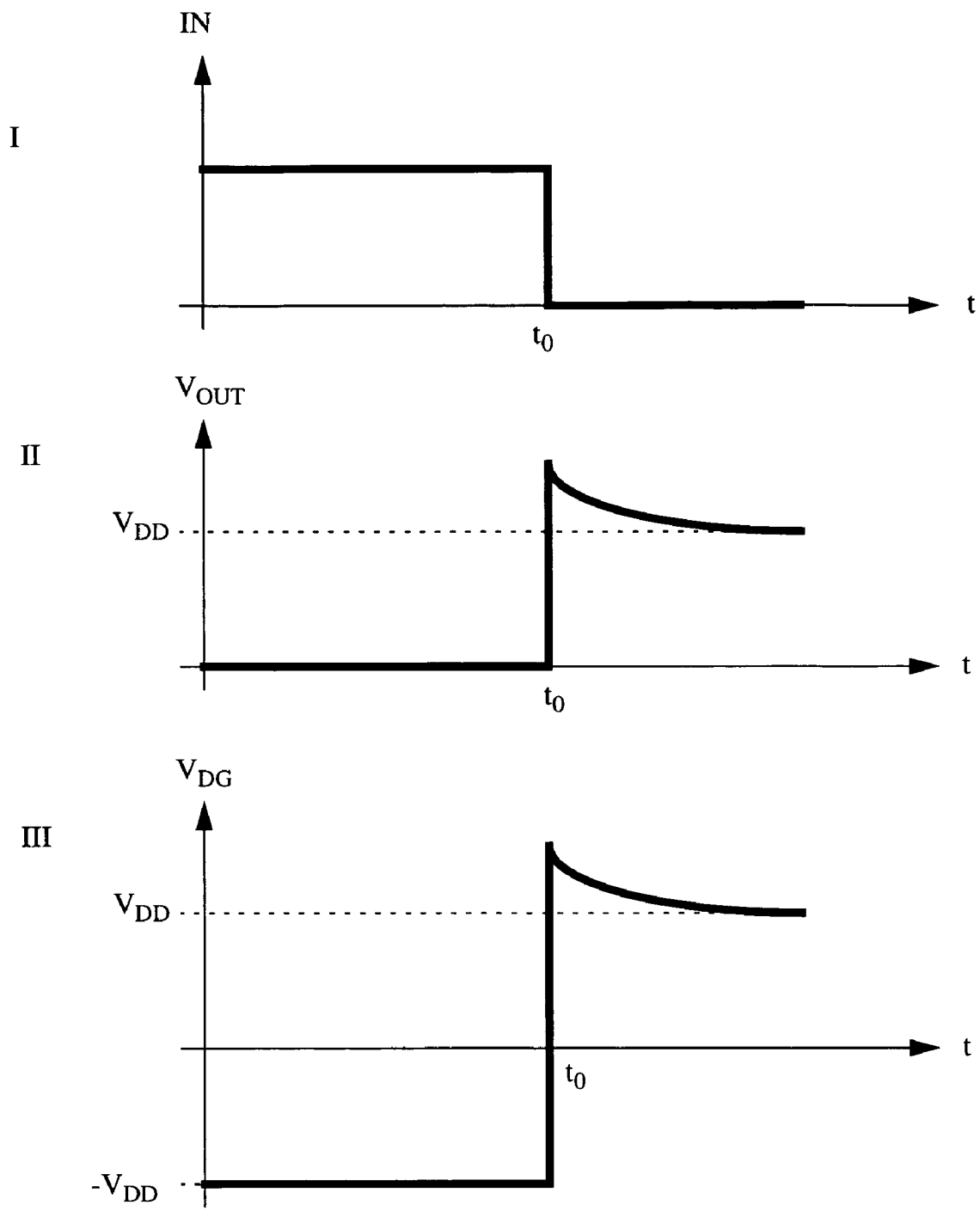
FIG. 1B is a graph illustrating the input signals, output signals, and drain-to-gate voltage parameters of the circuit shown in FIG. 1A as a function of a time parameter.
Figure 2A:
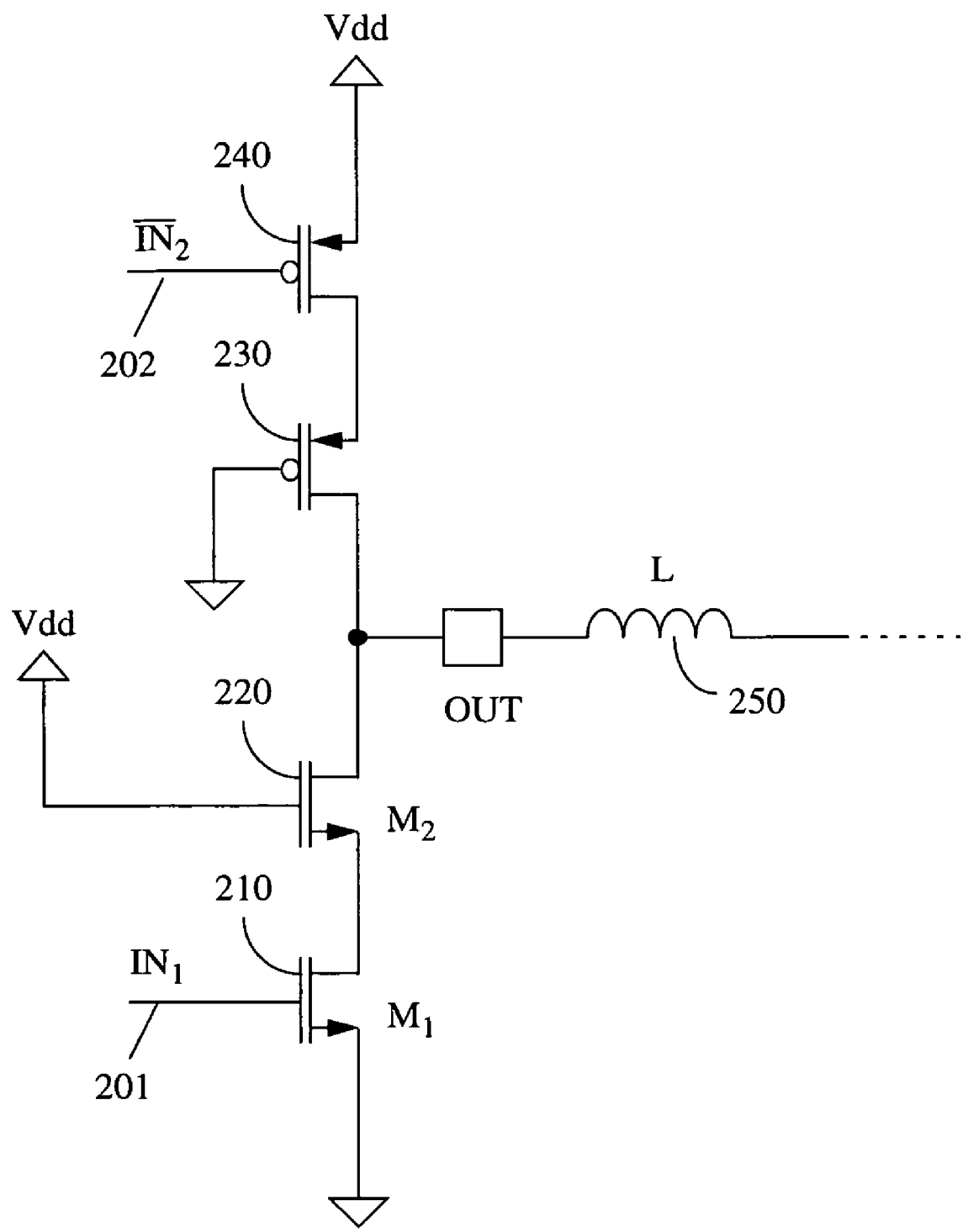
FIG. 2A is a circuit diagram illustrating an alternate prior art CMOS driver.
Figure 2B:
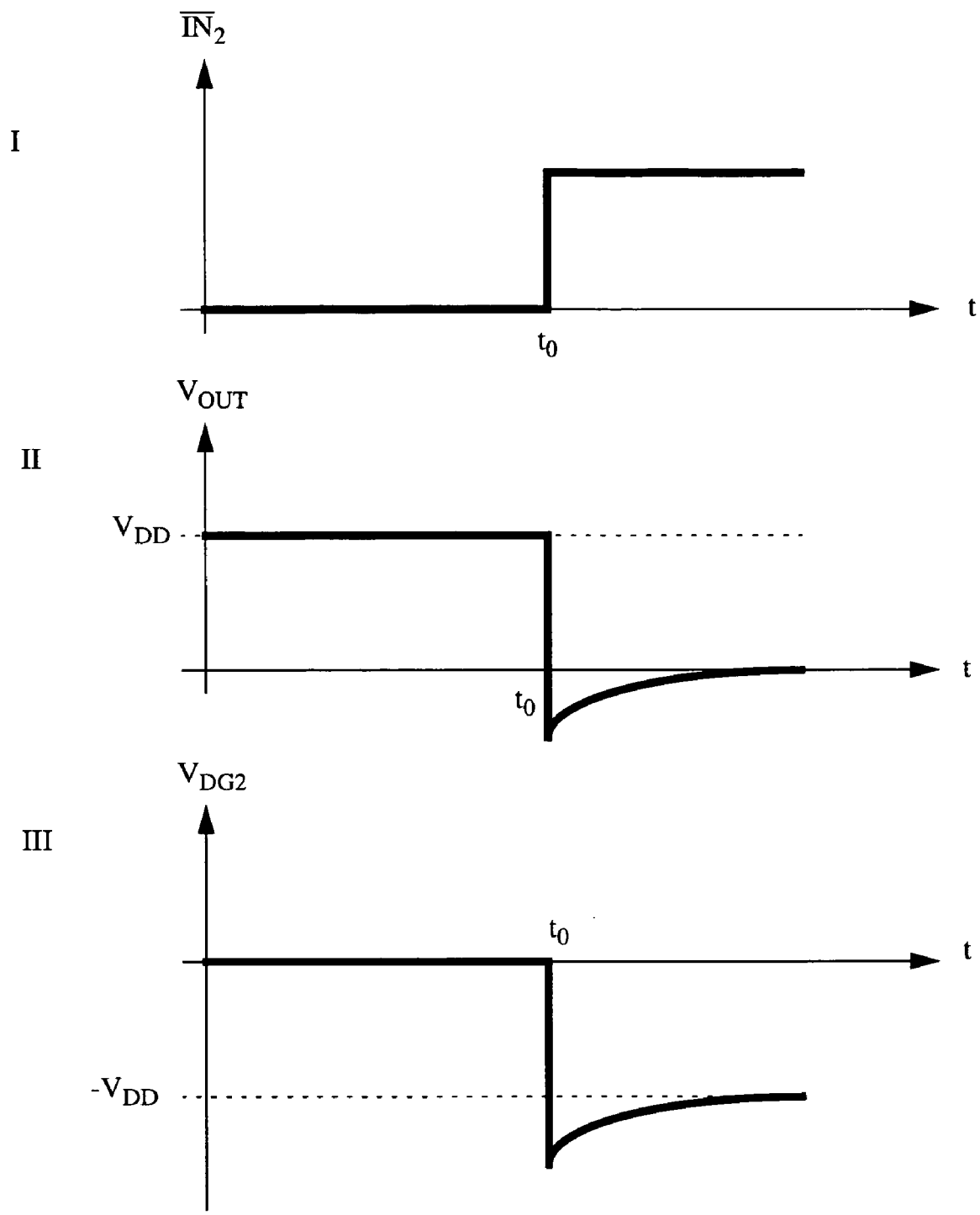
FIG. 2B is a graph illustrating the input signals, output signals, and drain-to-gate voltage parameters of the circuit shown in FIG. 2A as a function of a time parameter.
Figure 3A:
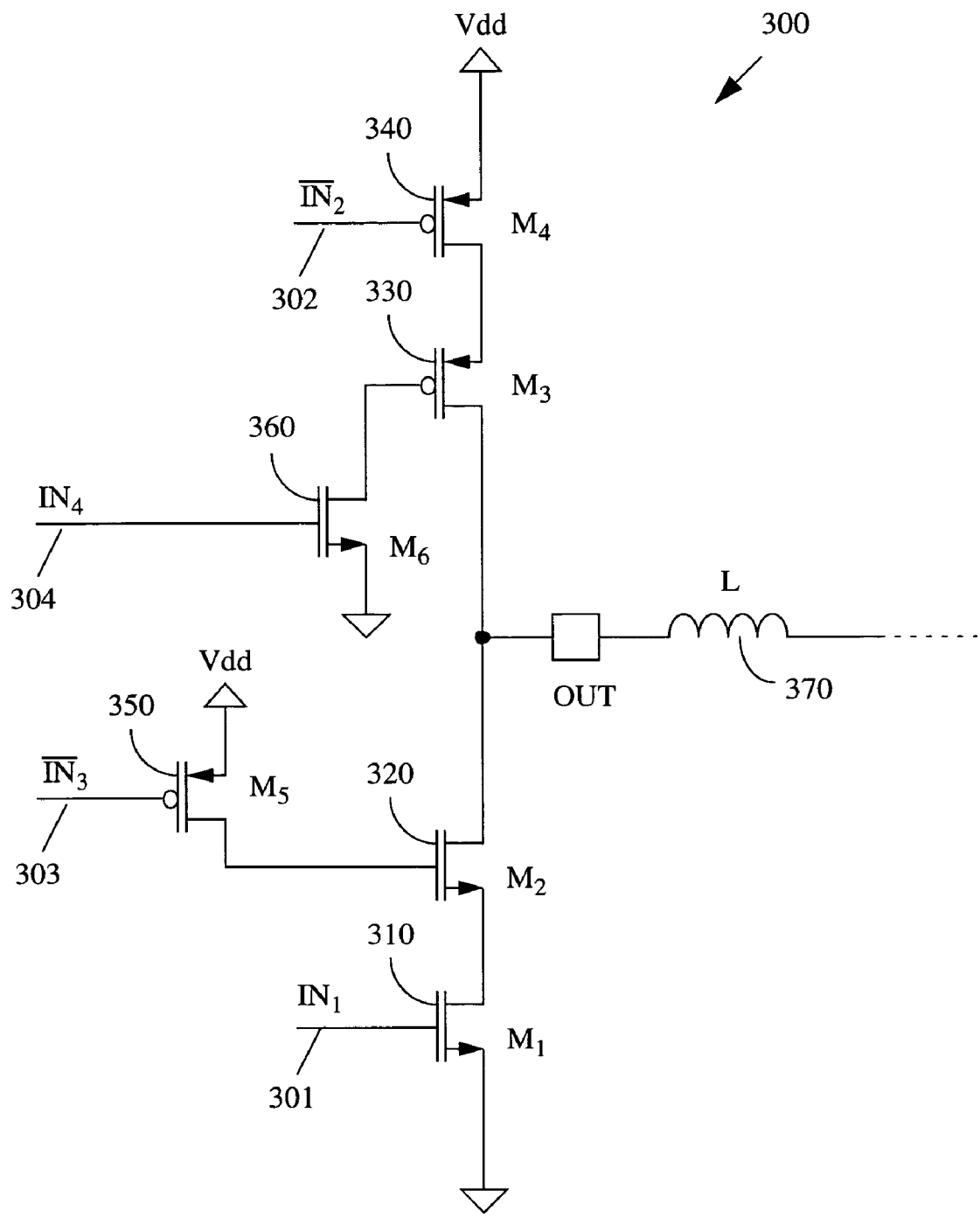
FIG. 3A is a circuit diagram illustrating a low voltage CMOS driver circuit for inductive loads, according to one embodiment of the invention.

FIG. 3A is a circuit diagram illustrating a low voltage CMOS driver circuit 300 for inductive loads, according to one embodiment of the invention. As illustrated in FIG. 3A, in one embodiment, Metal Oxide Semiconductor (MOS) transistor devices $M_1$ 310 and $M_2$ 320 are coupled in series, with the drain of transistor device $M_2$ 320 coupled to an inductive load 370. The gate of transistor device $M_2$ 320 is coupled to the drain of a MOS transistor device $M_5$ 350, which receives an input signal $^-IN_3$ 303 at its gate and has a supply voltage $V_{DD}$ applied at its source.

Corresponding transistor devices $M_3$ 330 and $M_4$ 340 are coupled in series, such that the gate of transistor device $M_3$ 330 is coupled to the drain of a MOS transistor device $M_6$ 360, which receives an input signal $IN_4$ 304 at its gate and has the source grounded. The gate of transistor device $M_4$ 340 receives an input signal $^-IN_2$ 302.

Figure 3B:
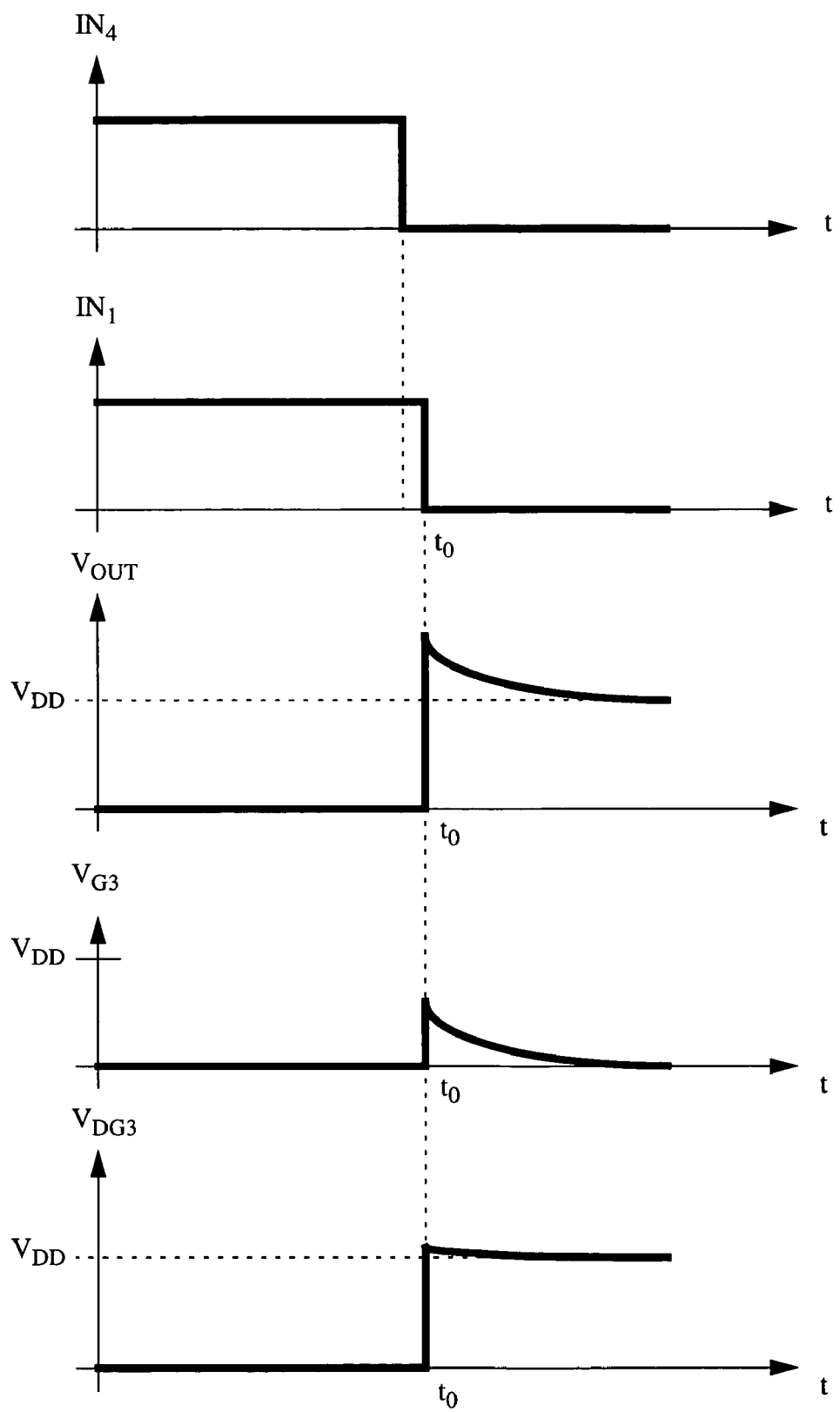
FIG. 3B is a graph illustrating the input signals, output signals, and drain-to-gate voltage parameters of the circuit shown in FIG. 3A as a function of a time parameter.

The gate of transistor device $M_1$ 310 receives an input signal $IN_1$ 301. Transistor device $M_2$ 320 works as a shield for the drain of transistor device $M_1$ 310. As illustrated in the graph of FIG. 3B, when the input signal $IN_4$ 304 goes to zero and transistor device $M_6$ 360 is turned off, then the input signal $IN_1$ goes to zero at a time $t_0$ and transistor device $M_1$ 310 is turned off, the gate of transistor device $M_3$ 330 is thus floating, and a drain-to-gate capacitance of $M_3$ is pushing the gate voltage $V_{G3}$ higher than ground, thus reducing the drain-to-gate voltage $V_{DG3}$ at the transistor device $M_3$ 330. In a similar embodiment, when the input signal $^-IN_3$ 303 goes high, transistor device $M_5$ 350 is turned off, then the input signal $^-IN_2$ goes high and transistor device $M_4$ 340 is turned off, the gate of transistor device $M_2$ 320 is thus floating, and a drain-to-gate capacitance of $M_2$ is pushing the gate voltage of $M_2$ 320 lower than $V_{DD}$, thus reducing the drain-to-gate voltage at the transistor device $M_2$ 320.

Figure 4:
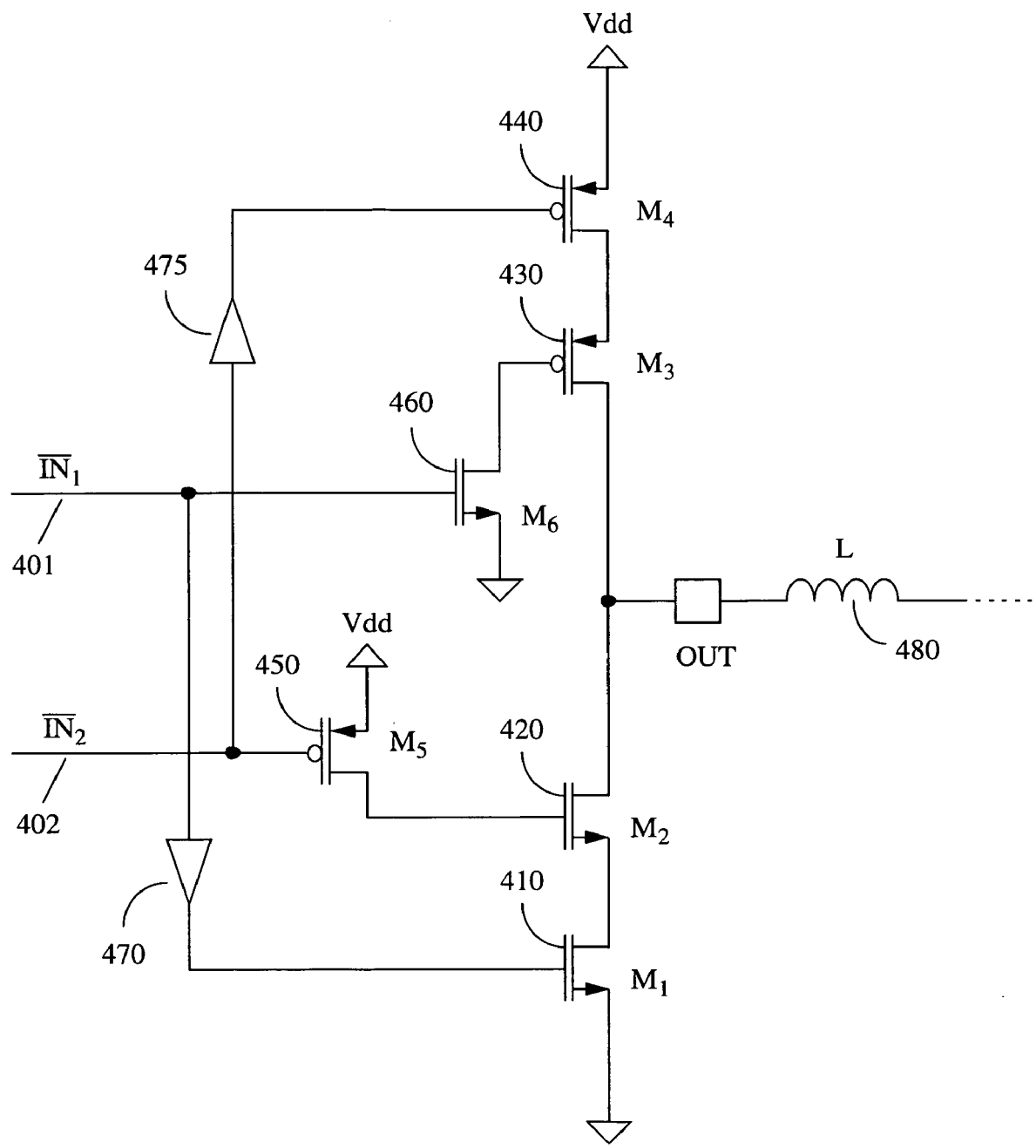
FIG. 4 is a circuit diagram illustrating a low voltage CMOS driver circuit for inductive loads, according to an alternate embodiment of the invention.

FIG. 4 is a circuit diagram illustrating a low voltage CMOS driver circuit for inductive loads, according to an alternate embodiment of the invention. As illustrated in FIG. 4, MOS transistor devices $M_1$ 410 and $M_2$ 420 are coupled in series, with the drain of transistor device $M_2$ 420 coupled to an inductive load L 480. The gate of transistor device $M_2$ 420 is coupled to the drain of a MOS transistor device $M_5$ 450, which receives an input signal $^-IN_2$ 402 at its gate and has the supply voltage $V_{DD}$ applied at its source. The gate of transistor device $M_1$ 410 is coupled to a buffer device 470, which receives an input signal $^-IN_1$ 401. Corresponding transistor devices $M_3$ 430 and $M_4$ 440 are coupled in series, such that the gate of transistor device $M_3$ 430 is coupled to the drain of a MOS transistor device $M_6$ 460, which receives the input signal $^-IN_1$ 401 at its gate and has the source grounded. The gate of transistor device $M_4$ 440 is coupled to a second buffer device 475, which receives the input signal $^-IN_2$ 402. In one embodiment described in connection with FIG. 3A, the presence of the buffer device 470 introduces a delay and guarantees that the transistor device $M_6$ 460 turns off prior to the transistor device $M_1$ 410. Similarly, the presence of the buffer device 475 introduces a delay and guarantees that the transistor device $M_5$ 450 turns off prior to the transistor device $M_4$ 440.

Figure 5A:
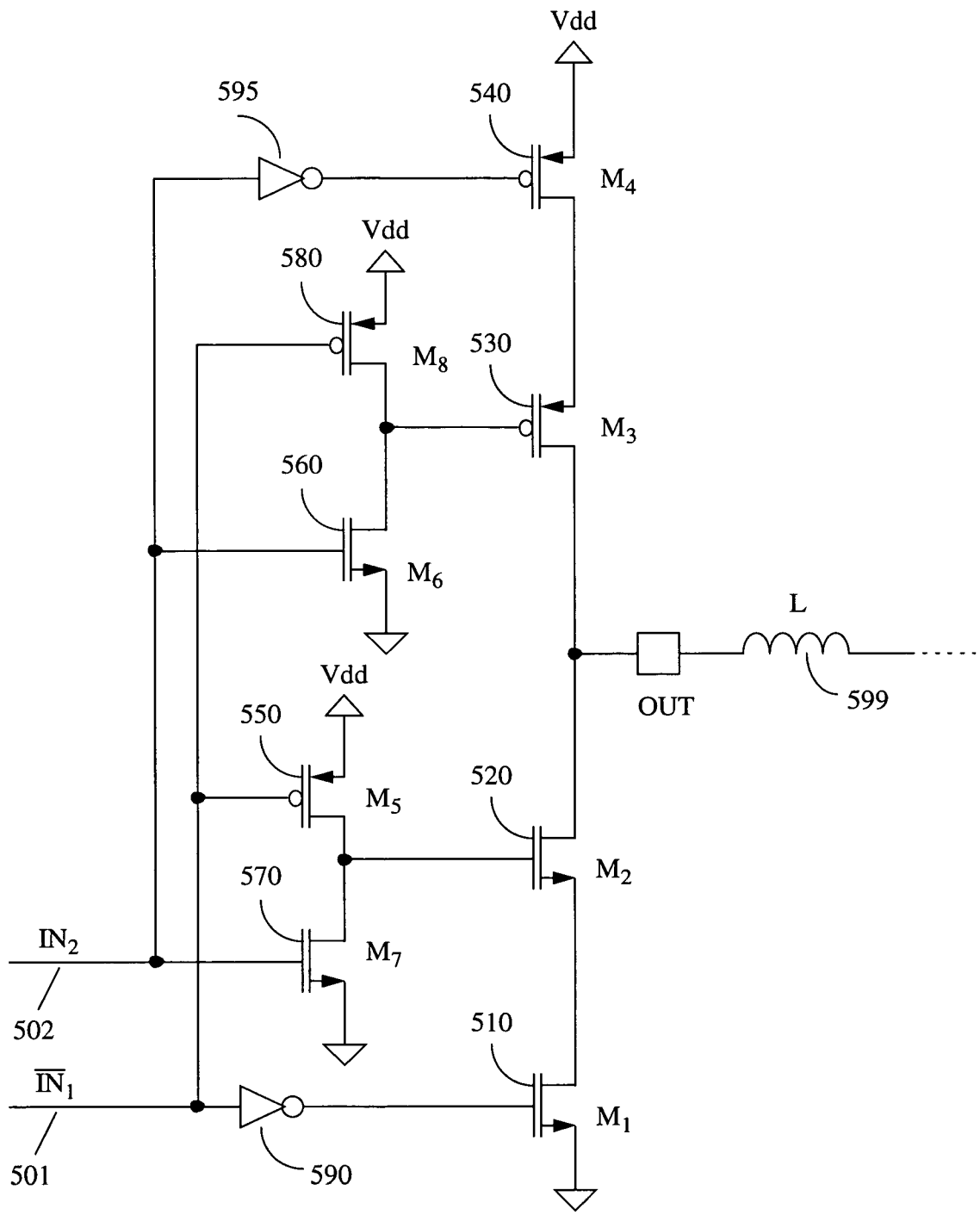
FIG. 5A is a circuit diagram illustrating a low voltage CMOS driver circuit for inductive loads, according to another alternate embodiment of the invention.

FIG. 5A is a circuit diagram illustrating a low voltage CMOS driver circuit for inductive loads, according to another alternate embodiment of the invention. As illustrated in FIG. 5A, MOS transistor devices $M_1$ 510 and $M_2$ 520 are coupled in series, with the drain of transistor device $M_2$ 520 coupled to an inductive load L 599. The gate of transistor device $M_2$ 520 is coupled to respective drains of MOS transistor devices $M_5$ 550 and $M_7$ 570. The gate of transistor device $M_5$ 550 receives an input signal $^-IN_1$ 501. A supply voltage $V_{DD}$ is applied at the source of the transistor device $M_5$ 550. The gate of transistor device $M_7$ 570 receives an input signal $IN_2$ 502. The source of the transistor device $M_7$ 570 is coupled to the ground. Corresponding transistor devices $M_3$ 530 and $M_4$ 540 are coupled in series, with the drain of transistor device $M_3$ 530 coupled to the inductive load L 599. The gate of transistor device $M_3$ 530 is coupled to respective drains of MOS transistor devices $M_6$ 560 and $M_8$ 580. The gate of transistor device $M_8$ 580 receives the input signal $^-IN_1$ 501. A supply voltage $V_{DD}$ is applied at the source of the transistor device $M_8$ 580. The gate of transistor device $M_6$ 560 receives the input signal $IN_2$ 502. The source of the transistor device $M_6$ 560 is coupled to the ground. An inverter device 595 is coupled to the gate of the transistor device $M_4$ 540, the inverter device 595 receiving the input signal $IN_2$ 502.

Figure 5B:
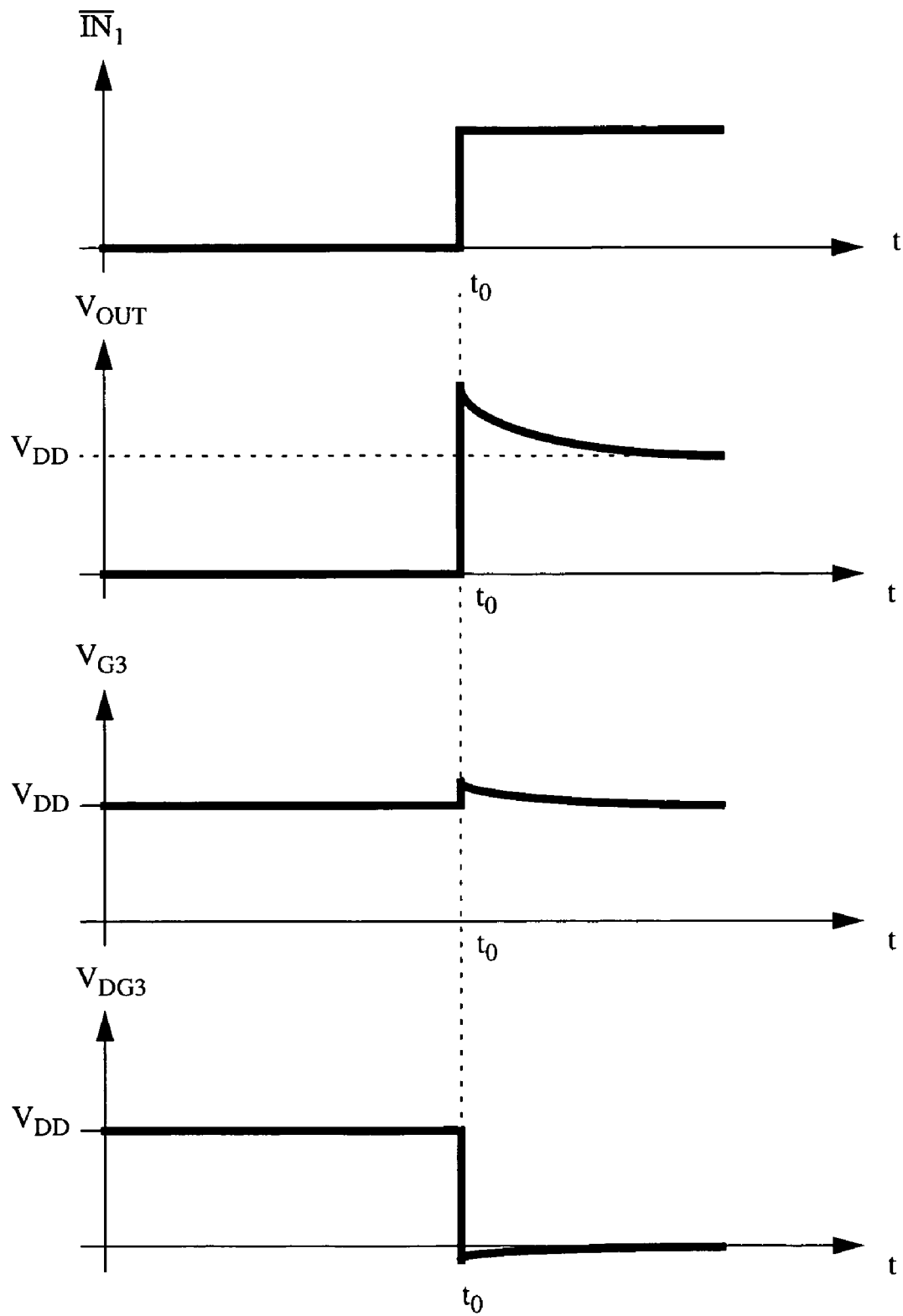
FIG. 5B is a graph illustrating the input signals, output signals, and drain-to-gate voltage parameters of the circuit shown in FIG. 5A as a function of a time parameter.

FIG. 5B is a graph illustrating the input signals, output signals, and drain-to-gate voltage parameters of the circuit shown in FIG. 5A as a function of a time parameter. In one embodiment, when the input signal $^-IN_1$ is low, transistor devices $M_1$ 510, $M_2$ 520, $M_5$ 550, and $M_8$ 580 are on, and the gate voltage $V_{G3}$ at the transistor device $M_3$ 530 is equal to the supply voltage value $V_{DD}$. When the input signal $^-IN_1$ goes high, then the transistor device $M_1$ 510 is turned off, the output voltage $V_{OUT}$ increases above the supply voltage $V_{DD}$, but the gate of the transistor device $M_3$ 530 is already at the supply voltage value $V_{DD}$, and, thus, the drain-to-gate voltage $V_{DG3}$ at the transistor device $M_3$ 530 falls to zero and is, thus, maintained below $V_{DD}$.

Similarly, when the input signal $IN_2$ is high, transistor devices $M_3$ 530, $M_4$ 540, $M_6$ 560, and $M_7$ 570 are on, and the gate voltage at the transistor device $M_2$ 520 is grounded. When the input signal $IN_2$ goes low, then the transistor device $M_4$ 540 is turned off, the output voltage $V_{OUT}$ goes below ground, but the gate of the transistor device $M_2$ 520 is already coupled to the ground, and, thus, the drain-to-gate voltage at the transistor device $M_2$ 520 falls to zero and is, thus, maintained below $V_{DD}$.

It is to be understood that embodiments of this invention may be used as or to support software programs executed upon some form of processing core (such as the CPU of a computer) or otherwise implemented or realized upon or within a machine or computer readable medium. A machine readable medium includes any mechanism for storing or transmitting information in a form readable by a machine, e.g. a computer. For example, a machine readable medium includes read-only memory (ROM); random access memory (RAM); magnetic disk storage media; optical storage media; flash memory devices; electrical, optical, acoustical or other form of propagated signals, e.g. carrier waves, infrared signals, digital signals, etc.; or any other type of media suitable for storing or transmitting information.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A circuit comprising:
   at least two first transistor devices, each first transistor device having a drain coupled to an inductive load;
   a respective second transistor device corresponding to said each first transistor device having a drain coupled to a gate of said each first transistor device; and
   a respective third transistor device corresponding to said each first transistor device having a drain coupled to a source of said each first transistor device;
   wherein, if a second transistor device corresponding to a first transistor device of said at least two first transistor devices is turned off, then a third transistor device corresponding to a remaining first transistor device of said at least two first transistor devices is turned off, a gate of said first transistor device is floating and a drain-to-gate voltage at said first transistor device is reduced to below a predetermined supply voltage applied at a source of said respective second transistor device.

2. The circuit according to claim 1, wherein said first, second, and third transistor devices are Metal Oxide Semiconductor (MOS) devices.

3. The circuit according to claim 1, wherein each of said second and third transistor devices receives a corresponding input signal at a respective gate, the circuit further comprising a respective buffer device coupled to said gate of said each third transistor device to introduce a delay in said corresponding input signal and to guarantee that said each third transistor device turns off subsequent to said corresponding second transistor device.

4. A method comprising:
   coupling a drain of each first transistor device of at least two first transistor device to an inductive load;
   coupling a drain of a respective second transistor device corresponding to said each first transistor device to a gate of said each first transistor device; and
   coupling a drain of a respective third transistor device corresponding to said each first transistor device to a source of said each first transistor device;
   wherein, if a second transistor device corresponding to a first transistor device of said at least two first transistor devices is turned off, then a third transistor device corresponding to a remaining first transistor device of said at least two first transistor devices is turned off, a gate of said first transistor device is floating and a drain-to-gate voltage at said first transistor device is reduced to below a predetermined supply voltage applied at a source of said respective second transistor device.

5. The method according to claim 4, wherein said first, second, and third transistor devices are Metal Oxide Semiconductor (MOS) devices.

6. The method according to claim 4, further comprising:
receiving a corresponding input signal at a respective gate of each of said second and third transistor devices; and
coupling a respective buffer device to said gate of said each third transistor device to introduce a delay in said corresponding input signal and to guarantee that said each third transistor device turns off subsequent to said corresponding second transistor device.

* * * * *